United States Patent
Lan et al.

[11] Patent Number: 5,906,043
[45] Date of Patent: May 25, 1999

[54] PROGRAMMABLE/REPROGRAMMABLE STRUCTURE USING FUSES AND ANTIFUSES

[75] Inventors: James J. D. Lan, Fremont; Steve S. Chiang, Saratoga, both of Calif.; William H. Shepherd, Placitas, N.M.; Paul Y. F. Wu, San Jose, Calif.

[73] Assignee: Prolinx Labs Corporation, San Jose, Calif.

[21] Appl. No.: 08/884,823

[22] Filed: Jun. 30, 1997

Related U.S. Application Data

[62] Division of application No. 08/374,941, Jan. 18, 1995.
[51] Int. Cl.⁶ ........................................ H01K 3/10
[52] U.S. Cl. ............................. 29/852; 29/600; 174/262; 287/530
[58] Field of Search ............................. 29/852, 832, 840, 29/825, 600; 257/530; 427/97; 174/262

[56] References Cited

U.S. PATENT DOCUMENTS

| | | |
|---|---|---|
| 3,335,327 | 8/1967 | Damon et al. . |
| 3,384,879 | 5/1968 | Stahl et al. . |
| 3,615,913 | 10/1971 | Shaw ...................................... 148/33.3 |
| 3,770,529 | 11/1973 | Anderson ..................................... 156/3 |
| 3,808,576 | 4/1974 | Castonguay et al. .................... 338/309 |
| 3,857,683 | 12/1974 | Castonguay ............................... 29/195 |
| 3,923,359 | 12/1975 | Newsam . |
| 4,024,629 | 5/1977 | Lemoine et al. . |
| 4,090,667 | 5/1978 | Crimmins . |
| 4,146,863 | 3/1979 | Mollenhoff ............................... 337/296 |
| 4,238,839 | 12/1980 | Redfern et al. ........................... 365/96 |
| 4,245,273 | 1/1981 | Feinberg et al. ......................... 361/382 |

(List continued on next page.)

FOREIGN PATENT DOCUMENTS

| | | |
|---|---|---|
| 0 336 359 | 10/1989 | European Pat. Off. . |
| 0510900A2 | 10/1992 | European Pat. Off. . |
| 59-11368 | 1/1984 | Japan . |

OTHER PUBLICATIONS

"AutoCAD® Release 12", *Autodesk, Inc.*, Jun. 28, 1993.

Deo, Narsingh, "Graph Theory with Applications to Engineering and Computer Science", *Prentice–Hall, Inc.*, 1974, pp. 390–395.

Dijkstra, E. W.,"A Note on Two Problems in Connexion with Graphs", *Numerische Mathematik 1*, 1959, pp. 269–271.

"Encore™ BGA for Single– and Few–Chip Modules", *Encore BGA backgrounder*, Harris Electronic Design Automation, Inc., 1966, pp. 1–6.

"EPO IC Packaging", www.uscad.com/epd/icpack.html, Jul. 30, 1996, 2 pages.

"Gerber Format Guide", *Gerber Systems Corporation*, Aug. 16, 1994, 6 pages.

(List continued on next page.)

*Primary Examiner*—Carl J. Arbes
*Attorney, Agent, or Firm*—Omkar K. Suryadevara; Skjerven, Morrill, MacPherson, Franklin & Friel, LLP

[57] ABSTRACT

In one embodiment, the steps for forming an electrical conductor between conductive layers of a printed circuit board include the following steps: (1) applying a first dielectric material on a first conductive layer; (2) forming a number of via holes at each of the predetermined locations in the first dielectric material at which an electrical conductor is to be formed; (3) selectively applying a second dielectric material to at least fill each of the via holes, to form a composite dielectric layer; (4) applying a second conductive layer on the composite dielectric layer; (5) etching the first conductive layer to form a first electrode; (6) etching the second conductive layer to form a second electrode; and (7) applying a programming voltage across the second dielectric material in each of the via holes to form an electrical conductor in each of the via holes, each electrical conductor connecting an electrode in the first conductive layer to an electrode in the second conductive layer.

17 Claims, 6 Drawing Sheets

U.S. PATENT DOCUMENTS

| | | | |
|---|---|---|---|
| 4,247,981 | 2/1981 | Walters | 29/845 |
| 4,386,051 | 5/1983 | Edgington | 420/589 |
| 4,399,372 | 8/1983 | Tanimoto et al. | 307/279 |
| 4,413,272 | 11/1983 | Mochizuki et al. . | |
| 4,420,820 | 12/1983 | Preedy | 365/105 |
| 4,424,578 | 1/1984 | Miyamoto | 365/104 |
| 4,433,331 | 2/1984 | Kollaritsch | 340/825.83 |
| 4,434,134 | 2/1984 | Darrow et al. | 419/5 |
| 4,455,495 | 6/1984 | Masuhara et al. | 307/44 |
| 4,458,297 | 7/1984 | Stopper et al. | 361/403 |
| 4,488,262 | 12/1984 | Basire et al. | 365/104 |
| 4,491,860 | 1/1985 | Lim . | |
| 4,507,756 | 3/1985 | McElroy | 365/104 |
| 4,507,757 | 3/1985 | McElroy | 365/104 |
| 4,547,380 | 10/1985 | Yamauchi | 361/104 |
| 4,562,639 | 1/1986 | McElroy . | |
| 4,565,712 | 1/1986 | Noguchi et al. | 427/53.1 |
| 4,566,186 | 1/1986 | Bauer et al. | 29/852 |
| 4,569,120 | 2/1986 | Stacey et al. . | |
| 4,569,121 | 2/1986 | Lim et al. . | |
| 4,585,490 | 4/1986 | Raffel et al. | 148/1.5 |
| 4,590,589 | 5/1986 | Gerzberg | 365/100 |
| 4,609,241 | 9/1986 | Peterson . | |
| 4,642,160 | 2/1987 | Burgess | 156/630 |
| 4,651,409 | 3/1987 | Ellsworth et al. . | |
| 4,652,974 | 3/1987 | Ryan | 361/395 |
| 4,678,889 | 7/1987 | Yamanaka | 219/121 LJ |
| 4,689,411 | 8/1987 | Dick et al. . | |
| 4,700,116 | 10/1987 | Inoue et al. | 318/254 |
| 4,700,214 | 10/1987 | Johnson . | |
| 4,710,592 | 12/1987 | Kimbara . | |
| 4,721,868 | 1/1988 | Cornell et al. | 307/465 |
| 4,726,991 | 2/1988 | Hyatt et al. | 428/329 |
| 4,731,704 | 3/1988 | Lochner | 361/400 |
| 4,732,780 | 3/1988 | Mitoff et al. | 427/125 |
| 4,748,490 | 5/1988 | Hollingsworth . | |
| 4,757,359 | 7/1988 | Chiao et al. . | |
| 4,780,670 | 10/1988 | Cherry | 324/158 P |
| 4,786,904 | 11/1988 | Graham, III et al. | 340/825.83 |
| 4,789,760 | 12/1988 | Koyama et al. . | |
| 4,791,075 | 12/1988 | Lin . | |
| 4,792,646 | 12/1988 | Enomoto . | |
| 4,792,835 | 12/1988 | Sacarisen et al. . | |
| 4,796,074 | 1/1989 | Roesner . | |
| 4,796,075 | 1/1989 | Whitten . | |
| 4,799,128 | 1/1989 | Chen | 361/414 |
| 4,799,984 | 1/1989 | Rellick | 156/89 |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. . | |
| 4,829,404 | 5/1989 | Jensen | 361/398 |
| 4,839,864 | 6/1989 | Fujishima | 365/200 |
| 4,840,924 | 6/1989 | Kinbara . | |
| 4,841,099 | 6/1989 | Epstein et al. . | |
| 4,845,315 | 7/1989 | Stopper | 361/428 |
| 4,847,732 | 7/1989 | Stopper et al. | 361/395 |
| 4,864,165 | 9/1989 | Hoberman et al. | 307/467 |
| 4,873,506 | 10/1989 | Gurevich | 337/290 |
| 4,874,711 | 10/1989 | Hughes et al. . | |
| 4,876,220 | 10/1989 | Mohsen et al. . | |
| 4,881,114 | 11/1989 | Mohsen et al. . | |
| 4,882,611 | 11/1989 | Blech et al. . | |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. . | |
| 4,910,418 | 3/1990 | Graham et al. | 307/465 |
| 4,910,584 | 3/1990 | Mizuo . | |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach . | |
| 4,933,738 | 6/1990 | Orbach et al. . | |
| 4,935,584 | 6/1990 | Boggs | 174/262 |
| 4,937,475 | 6/1990 | Rhodes et al. | 307/465 |
| 4,940,181 | 7/1990 | Juskey, Jr. et al. | 228/180.2 |
| 4,943,538 | 7/1990 | Mohsen et al. . | |
| 4,949,084 | 8/1990 | Schwartz et al. | 340/825.83 |
| 4,964,948 | 10/1990 | Reed | 156/659.1 |
| 4,969,124 | 11/1990 | Luich et al. | 365/201 |
| 4,970,579 | 11/1990 | Ardt et al. . | |
| 4,974,048 | 11/1990 | Chakravorty et al. . | |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. . | |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,070,384 | 12/1991 | McCollum et al. . | |
| 5,072,289 | 12/1991 | Sugimoto et al. . | |
| 5,077,451 | 12/1991 | Mohsen | 174/261 |
| 5,087,589 | 2/1992 | Chapman et al. . | |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. . | |
| 5,108,541 | 4/1992 | Schneider et al. | 156/631 |
| 5,120,679 | 6/1992 | Boardman et al. . | |
| 5,136,366 | 8/1992 | Worp et al. . | |
| 5,142,263 | 8/1992 | Childers et al. | 338/21 |
| 5,144,567 | 9/1992 | Oelsch et al. | 364/708 |
| 5,148,265 | 9/1992 | Khandros et al. . | |
| 5,148,355 | 9/1992 | Lowe et al. | 361/410 |
| 5,155,577 | 10/1992 | Chance et al. | 357/71 |
| 5,166,556 | 11/1992 | Hsu et al. | 307/465 |
| 5,181,096 | 1/1993 | Forouhi | 257/530 |
| 5,181,859 | 1/1993 | Foreman et al. | 439/225 |
| 5,189,387 | 2/1993 | Childers et al. | 338/20 |
| 5,191,511 | 3/1993 | Sawaya | 361/383 |
| 5,196,724 | 3/1993 | Gordon et al. | 257/530 |
| 5,200,652 | 4/1993 | Lee | 307/465 |
| 5,203,075 | 4/1993 | Angulas et al. | 29/830 |
| 5,210,940 | 5/1993 | Kawakami et al. | 29/852 |
| 5,216,278 | 6/1993 | Lin et al. | 257/688 |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi . | |
| 5,258,643 | 11/1993 | Cohen | 257/530 |
| 5,260,519 | 11/1993 | Knickerbocker et al. | 174/262 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,287,620 | 2/1994 | Suzuki et al. | 29/852 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |

| | | |
|---|---|---|
| 5,321,322 | 6/1994 | Verheyen et al. .................... 307/465.1 |
| 5,328,087 | 7/1994 | Nelson et al. ........................... 228/175 |
| 5,329,153 | 7/1994 | Dixit ...................................... 257/530 |
| 5,345,106 | 9/1994 | Doering et al. ......................... 257/675 |
| 5,346,750 | 9/1994 | Hatakeyama et al. .................. 428/209 |
| 5,347,258 | 9/1994 | Howard et al. ......................... 338/333 |
| 5,349,248 | 9/1994 | Parlour et al. ........................... 307/465 |
| 5,362,676 | 11/1994 | Gordon et al. . |
| 5,367,764 | 11/1994 | DiStefano et al. ........................ 29/830 |
| 5,377,124 | 12/1994 | Mohsen .................................. 364/489 |
| 5,397,921 | 3/1995 | Karnezos ................................ 257/779 |
| 5,402,318 | 3/1995 | Otsuka et al. ........................... 361/794 |
| 5,404,637 | 4/1995 | Kawakami ............................... 29/843 |
| 5,409,865 | 4/1995 | Karnezos ................................ 437/210 |
| 5,411,917 | 5/1995 | Forouhi et al. . |
| 5,420,456 | 5/1995 | Galbi et al. ............................. 257/529 |
| 5,420,460 | 5/1995 | Massingill .............................. 257/693 |
| 5,424,492 | 6/1995 | Petty et al. .............................. 174/250 |
| 5,427,979 | 6/1995 | Chang . |
| 5,435,480 | 7/1995 | Hart et al. ............................ 228/180.1 |
| 5,436,412 | 7/1995 | Ahmad et al. .......................... 174/265 |
| 5,438,166 | 8/1995 | Carey et al. ............................ 174/261 |
| 5,449,947 | 9/1995 | Chen et al. . |
| 5,451,811 | 9/1995 | Whitten et al. ......................... 257/530 |
| 5,464,790 | 11/1995 | Hawley . |
| 5,468,995 | 11/1995 | Higgins, III ........................... 257/697 |
| 5,481,795 | 1/1996 | Hatakeyama et al. .................... 29/852 |
| 5,487,218 | 1/1996 | Bhatt et al. ............................... 29/852 |
| 5,502,889 | 4/1996 | Casson et al. ............................ 29/830 |
| 5,537,108 | 7/1996 | Nathan et al. ...................... 340/825.84 |
| 5,552,627 | 9/1996 | McCollum et al. . |
| 5,565,703 | 10/1996 | Chang . |
| 5,572,409 | 11/1996 | Nathan et al. .......................... 361/806 |
| 5,574,311 | 11/1996 | Matsuda ................................. 257/697 |
| 5,583,376 | 12/1996 | Sickler et al. .......................... 257/702 |
| 5,583,378 | 12/1996 | Marrs et al. ............................ 257/710 |
| 5,612,574 | 3/1997 | Summerfelt et al. ................... 257/783 |
| 5,639,684 | 6/1997 | Kwok . |
| 5,640,308 | 6/1997 | Osann, Jr. et al. ..................... 361/777 |
| 5,654,564 | 8/1997 | Mohsen .................................. 257/209 |
| 5,723,358 | 3/1998 | Manley . |
| 5,770,885 | 6/1998 | McCollum et al. . |

OTHER PUBLICATIONS

Yu, et al., "Single–Layer Fanout Routing and Routability Analysis for Ball Grid Arrays", *1995 IEEE/ACM International Conference on Computer–Aided Design*, Nov. 5–9, 1995, pp. 581–586.

Hwang, Jennie S., "Solder Paste in Electronics Packaging Technology and Applications in Surface Mount, Hybrid Circuits, and Component Assembly", *Van Nostrand Reinhold*, 1992, pp. xv–xx and 59–62.

"Polyswitch Resettable Fuses for Circuit Protection Information Package", Raychem Corporation, Electronics Division, Nov. 9, 1992.

Ruschau et al., "Critical Volume Fractions in Conductive Composites", *Journal of Composite Materials*, vol. 26, No. 18/1992, pp. 2727–2735.

Chiang et al., "Conductive Channel in ONO Formed by Controlled Dielectric Breakdown", 1992 Symposium on VLSI Technology Digest of Technical Papers, pp. 20–21.

"Matsushita Team Eliminates Holes in High–Density PCB", Tsuda, Nikkei Electronics Asia, Mar. 1995, pp. 69–70.

"Printed Circuit Board Design Guidelines For Ball Grid Array Packages", Johnston, Motorola, Inc., pp. 255–260.

"An Enhanced Performance Low Cost BGA Package", Marrs, etc., Amkor Electronics, Inc., pp. 214–225.

"A Large Format Modified TEA $CO_2$ Laser Based Process For Cost Effective Small Via Generation", J.M. Morrison etc., MCM 1994 Proceedings, pp. 369–377.

"The Application of Laser Process Technology to Thin Film Packaging", T.F. Redmond etc., IEEE, 1992, pp. 1066–1071.

"A New Circuit Substrate For MCM–L", Yusuke Wada etc., ICEMCM, 1995, pp. 59–64.

"Rigid–Flex" The Old and the New, Jahn Stopperan, Shendahl, Inc., 1990, 4 pages.

"High–Performance Scalable Switch Design", Joshua Silver, ASIC & EDA, Jun. 1994, pp. 38–48.

"Dielectric Based Antifuse For Logic and Memory ICs", Esmat Hamdy etc., IEEE 1988, pp. 786–789.

"Advanced Single Poly BiCMOS Technology For High Performance Programmable TTL/ECL Applications", Ali Iranmanesh etc., IEEE Bipolar Circuits and Technology Meeting, 1990, 4 pages.

"Conducting Filament of the Programmed Metal Electrode Amorphose Silicon Antifuse", Kathryn E. Gordon etc., IEEE, 1993, pp. 27–30.

"Interconnect Devices for Field Progammable Gate Array", Chenming Hu, IEEE, 1992, pp. 591–594.

"Antifuse Structure Comparison For Field Programmable Gate Arrays", Steve Chiang etc., IEEE, 1992, pp. 611–614.

ASM Handbook, vol. 3, "Alloy Phase Diagrams", ASM International, 4 pages.

"Interplay of Energies in Circuit Breaker and Fuse Combinations", Bernie DiMarco etc., IEEE, 1991, pp. 1765–1769.

"Laser Personalization of NMOS Digital Topologies", James B. Gullett etc., IEEE, 1983, pp. 1249–1252.

"I/O Buffering System to a Programmable Switching Apparatus", Wen–Jai Hsieh etc., Official Gazette, Jan. 25, 1994, one page.

"Characterizing Quickturn ASICS: It's Done With Mirrors", Ron Iscoff, Semiconductor International, Aug. 1990, 6 pages.

"An Ultra High Speed ECL Programmable Logic Device", Fred Ki etc., IEEE Bipolar Circuits and Technology Meeting, 1990, 5 pages.

"Distribution Fuses of Nearest Future", T. Lipski, 3rd International Conference on Future Trends in Distribution Switch Gear, Jul. 26, 1990, pp. 41–45.

"An Advancement in the Design and Application of Current–Limiting Fuses", R. Ranjan etc., General Electric Company, pp. 36–40.

"A Novel MOS PROM Using a Highly Resistive Poly–Si Resistor", Masafumi Tanimoto etc., IEEE, 1980, 4 pages.

"CMOS Resistive Fuse Circuits", Hae–Seung Lee etc., Dept. of Electrical Engineering and Computer Science, Massachusetts Institute of Technology, 1990, pp. 109–110.

"CMOS Resistive Fuses For Image Smoothing and Segmentation", Paul C. Yu etc., IEEE, 1992, pp. 545–553.

Letter to Hugo Goris from J. Rapaille, Philips Components, dated Jul. 6, 1994, two pages.

"Process Considerations In Restructurable VLSI For Wafer–Scale Integration", P. W. Wyatt, etc., IEDM, 1984, pp. 626–629.

"A Laser Linking Process For Restructurable VLSI", G. H. Chapman, etc., CLEO, Apr., 1982, pp. 1–4.

"Taiyo PSR–4000 Photoimageable Solder Mask (Two–Part Aqueous Developing System)", Taiyo America, Inc., Feb. 24, 1992, pp. 1–8.

"Ball Grid Array Technology", John H. Lau, McGraw–Hill, Inc., 1995, p. 38.

PROGRAMMABLE/REPROGRAMMABLE STRUCTURE USING FUSES AND ANTIFUSES

This application is a division of application Ser. No. 08/374,941, filed Jan. 18, 1995.

CROSS REFERENCE TO RELATED APPLICATION

This application is related to U.S. patent application Ser. No. 08/320,145, by Richard J. Nathan, James J. D. Lan, Steve S. Chiang and William H. Shepherd, filed Oct. 7, 1994, that is incorporated herein in its entirety.

FIELD OF INVENTION

The present invention is related to a method of forming an electrical conductor between layers of a printed circuit board and to the resulting printed circuit board. More particularly, the present invention is related to the formation of an electrical conductor between two electrodes of a printed circuit board by applying a programming voltage across a dielectric layer that separates the two electrodes.

BACKGROUND

One of the most expensive steps in fabrication of a multi-layered printed circuit board is formation of an electrical conductor (sometimes called via) between the layers by drilling a via hole through the layers and plating the via hole with a conductive layer.

One desirable characteristic of a via in a printed circuit board is smaller size that permits larger number of traces to be formed in a printed circuit board of a given area. Conventional drilling process is mechanical. As the size of the via hole to be drilled becomes smaller, the drill bit size decreases and the cost of making a small and precise drill bit goes up. Additionally, the low mechanical strength of a small drill bit causes faster wear as compared to a large drill bit.

Therefore the cost of mechanically drilling a small hole increases exponentially with decreasing hole size. Another disadvantage of mechanical drilling is that a drill bit wears out after being used a number of times.

The mechanical drilling process needs a target area (sometimes called "land") that is larger than the drill bit's size, to account for possible misalignment during drilling. The diameter of the land is typically 10 to 15 mils larger than the drill bit diameter. The space used to satisfy the land requirement also substantially limits the number of traces that can be formed in a given area. For typical state of the art processing, where a conductive line (also referred to as "trace" or "electrode") and space have widths 3 mils/3 mils respectively, the via holes diameter is 8 mils, with 13 to 15 mils diameter in land space.

Another problem with mechanical drilling is that a conductive layer must be plated inside the via hole. The smaller the via hole, the larger the aspect ratio between the layer's thickness and the drill's hole diameter, and the more difficult it is to plate the via hole.

A method to inexpensively reduce the via hole's size and create a reliable conductive path in the via hole is highly desirable.

A laser method, by focusing the energy from a laser beam, can create a very small hole having a diameter for example in 1 to 2 mil range. The laser method avoids the problem of drill bit wear. However the laser method is expensive, and the hole's size and the impact on the material are not reproducible. Also the initial setup cost of the laser method is very high.

Another approach is to etch vias with a dry etch process. A large number of vias can be etched simultaneously, which eliminates the drill bit wear problem. In the dry etch method, a thin polyimide layer with copper foils laminated on each side is used as the starting core layer. Photoresist is applied on both sides to define photo via holes. After chemical copper etching and resist stripping, polyimide inside the original photo via hole (where the copper is already removed) is exposed to plasma. After the polyimide is etched away inside the via hole, a metallization step is performed to coat an electrically conductive layer inside the via hole. Another photo masking and etch step is performed to create conductive trace patterns (e.g. of copper) on both sides of the core layer and with vias connecting traces from each side of the core layer.

The dry etch process also has several disadvantages. Alignment/registration tolerance is high as two images from each side must coincide. Without such alignment, the created via hole could have a zig-zagged shaped surface that is unreliable after metallization. The laminate must be very thin as a plasma etch takes very long time (as compared to other printed circuit board processes). The substrate material may be limited to polyimide, as the heat generated in the dry etch is high and thermal mismatch between substrate and copper could create buckling or delamination.

Another alternative to the mechanical drilling process is use of a photoresist process to create a small via hole, e.g. 2 mils in diameter. Then the surface is metallized followed by trace definition on the photoresist surface. The imaging material could be a photosensitive photoresist, or it could be a dry film pressed to the surface. This method allows a large number of vias to be produced simultaneously at a very low cost. Once the photo resist opening is created, the current practice is to do electroless copper deposition and create an electrically conductive layer inside the via hole. Since the electrically conductive layer in general doesn't adhere to the electrically nonconductive photo resist wall, chemical treatment is necessary to roughen the surface of the via hole before applying the electrically conductive layer. Such chemical treatment also roughens the top surface of the photoresist. For a thin photoresist layer, such roughness on the top surface is undesirable as it increases the chances of shorts between two electrode layers. Further, roughening the via hole increases the photo via hole's size. By the time a photo via hole has been prepared for the electrically conductive layer deposition, the hole size has increased substantially. Since the roughening process is less controllable, the quality of the plated via is not as reproducible. Also, the registration capability is poor at present for trace definition that overlaps the via hole. The technology is not mature enough yet to fully reduce the via pitch even if the via size is very small.

Yet another method uses conductive epoxy resin. After the via hole is created, a conductive epoxy is formed inside the via hole. This method offers via pitch reduction. However, conductive epoxy doesn't adhere well to an electrode if the electrode is made of copper. Moreover, copper can oxidize and create high resistance. To make the contact reliable, inert metals like gold are sometime used to form an interface between conductive epoxy resin and copper electrode, which increases the cost and can present process compatibility problems.

SUMMARY

In one embodiment of this invention, a number of locations of a printed circuit board at which an electrical conductor is to be formed between two conductive layers are determined based on the circuit to be implemented in the printed circuit board. A number of photo via holes are formed at the locations in the dielectric layer that separates the two conductive layers. The via holes are then filled with a dielectric material of low breakdown voltage, as compared to the breakdown voltage of the dielectric layer. Then a programming voltage is applied across the dielectric material in the via holes to form an electrical conductor in the via holes.

In one embodiment, the steps for forming an electrical conductor between conductive layers of a printed circuit board include the following steps: (1) applying a first dielectric material on a first conductive layer; (2) forming a number of via holes at each of the predetermined locations in the first dielectric material at which an electrical conductor is to be formed; (3) selectively applying a second dielectric material to at least fill each of the via holes, to form a composite dielectric layer; (4) applying a second conductive layer on the composite dielectric layer; (5) etching the first conductive layer to form a first electrode; (6) etching the second conductive layer to form a second electrode; and (7) applying a programming voltage across the second dielectric material in each of the via holes to form an electrical conductor in each of the via holes, each electrical conductor connecting an electrode in the first conductive layer to an electrode in the second conductive layer.

The use of an electrical conductor of a programmed antifuse instead of a conventional via has several advantages. The electrical conductor (also referred to as an "antifuse-via") can be formed selectively anywhere an electrode of one layer crosses an electrode of another layer without the need to use a drill bit. The present invention allows the use of any of several methods of manufacturing an antifuse in a printed circuit board to create an antifuse via. One method is to start with photo resist and create a photo via hole. Then, instead of plating the created via hole, a nonconductive dielectric antifuse material, such as a polymer loaded with conductive particles(composite polymer) is applied over the entire surface in addition to fill the via hole. Finally a top metal electrode is formed over the antifuse.

The above method can be simplified to eliminate the formation of via holes by providing a layer of antifuse material (such as polymer/particle composite) sandwiched between two conductive layers instead of the dielectric material. After printing and etching to create electrodes of a first conductive layer and electrodes of a second conductive layer each location of overlap between an electrode of the first layer and an electrode of the second layer becomes a possible site for an antifuse via. By selectively programming the antifuse material at predetermined sites, connection is made between the two electrodes through a programmed antifuse conductive path.

In one embodiment, two antifuses are programmed together (simultaneously) by applying programming voltage only to one conductive layer. In another embodiment, antifuse material is programmed using both conductive layers

DETAILED DESCRIPTION

Antifuses can be used as programmable interconnect in substrates other than silicon, such as the printed circuit substrate(PCB) and multichip module substrate(MCM) as described in, for example, U.S. patent application Ser. No. 08/320,145, filed by B. Nathan et al. on Oct. 7, 1994, entitled PROGRAMMABLE/REPROGRAMMABLE STRUCTURE USING FUSES AND ANTIFUSES, that is incorporated by reference herein in its entirety.

In MCM form, the substrate can be either plastic or ceramic. When antifuses are used as programmable interconnects, a matrix structure is created and only antifuses in the antifuse matrix that are needed to form interconnects are programmed (to form a short). The unprogrammed antifuses in the matrix remain open.

The present invention also uses programmed antifuses as interconnects. In this invention, the location of each site of an electrical conductor that connects two conductive layers is predetermined by the circuit design requirement of the printed circuit board to be fabricated. In a site that needs a via, an antifuse is fabricated and the antifuse is programmed to form an electrical conductor (also referred to as "antifuse via"). A matrix of antifuses is not necessary in one embodiment of this invention.

As the antifuse material can be applied in one step, this invention eliminates the mechanical drilling of many vias and dramatically reduces the spacing requirement. Also because antifuse material is nonconductive, this invention also avoids the adhesion problem of requiring the material (such as copper) located in a via hole to adhere to the wall of the via hole. The programming step to create an electrical conductor, also called a short in the antifuse material can be accomplished during testing of a printed circuit board. In addition to checking whether an antifuse via is open or short, a predetermined programming voltage and a predetermined programming current are applied such that the antifuse material breaks down and creates a permanent short.

Figure 1:
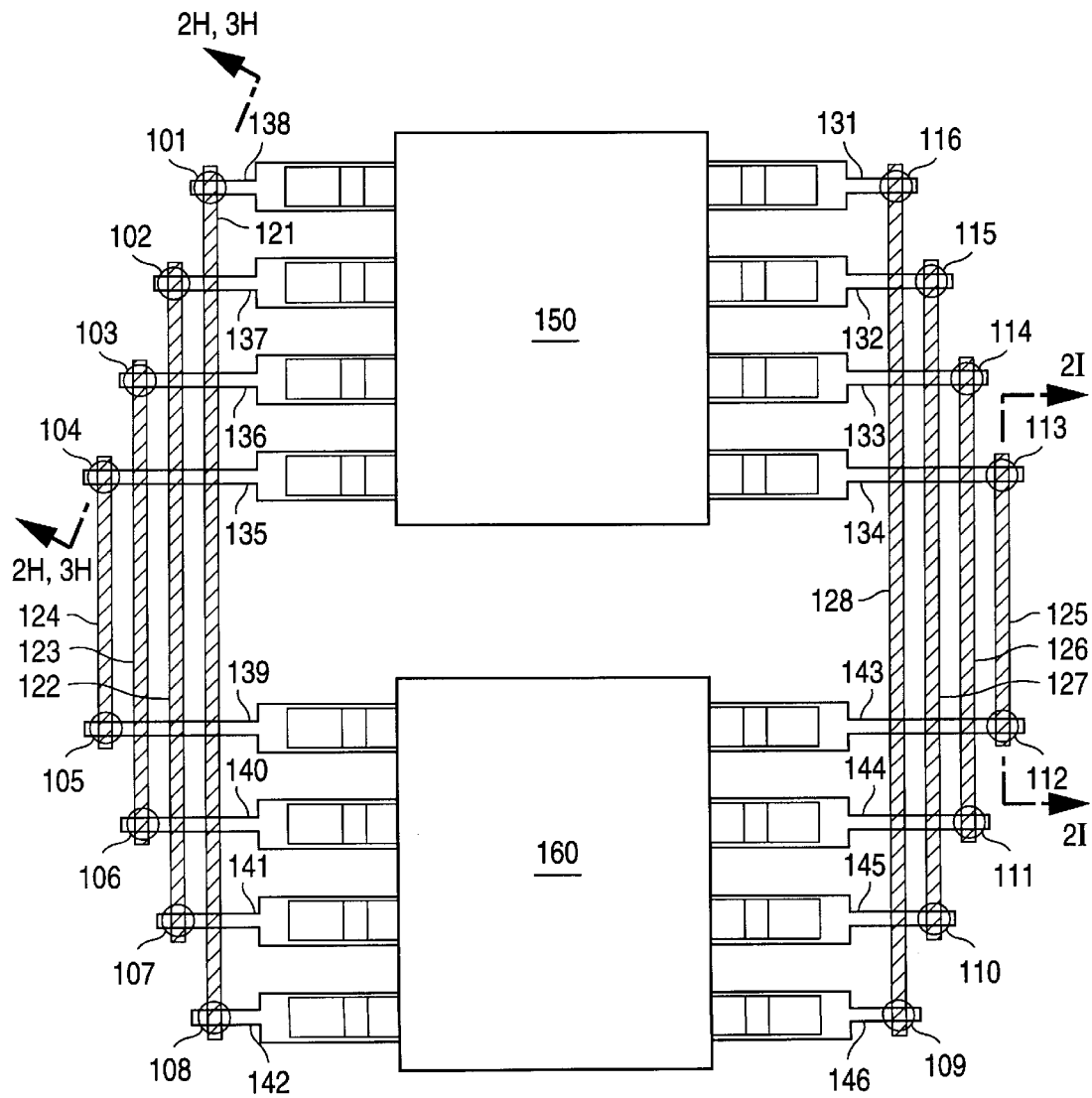
FIG. 1 illustrates in plan view the traces of a printed circuit board that has antifuse-vias.

FIG. 1 illustrates traces 131–146 of a second conductive layer and traces 121–128 of a first conductive layer that are connected by antifuse-vias 101–116 in accordance with the present invention. The traces 131–146 and 121–128 can be used to form a printed circuit board to implement a predetermined circuit that couples integrated circuits 150 and 160.

The first and second conductive layers are separated from each other by a dielectric layer. The dielectric layer is formed of a first dielectric material and has a number of via holes that extend from the first conductive layer to the second conductive layer. The holes are filled with an antifuse material. Electrical conductors connecting traces 121–128 of the first conductive layer and traces 131–146 of the second conductive layer are formed through the antifuse material by application of a programming voltage. The antifuse material has a breakdown voltage less than the breakdown voltage of the first dielectric material. The first dielectric material is a printed circuit board dielectric material such as photoresist material, solder mask, epoxy resin and photo imagible polyimide. The first electrode and the second electrode are electrodes in a printed circuit board, such as electrolytic plated copper electrodes or copper foil electrodes.

Figure 2A:
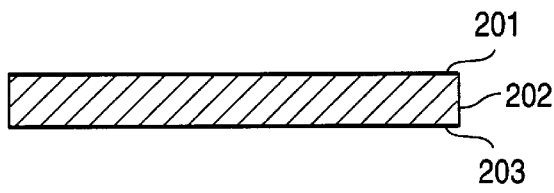
FIGS. 2A–2I illustrate structures formed during the formation of antifuse-vias in one embodiment of this invention.
Figure 2B:
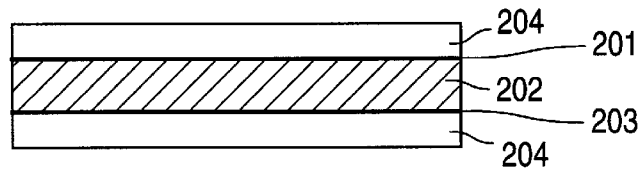
Figure 2C:
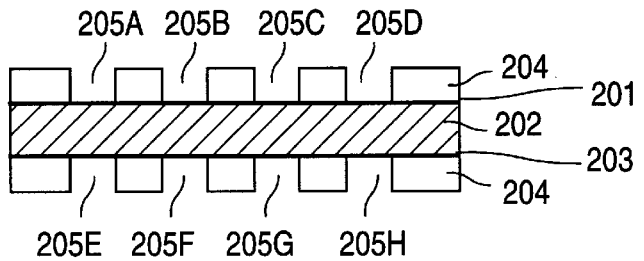
Figure 2D:
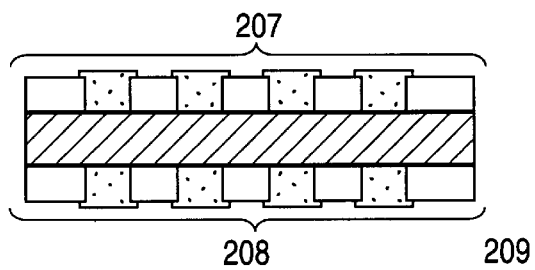
Figure 2E:
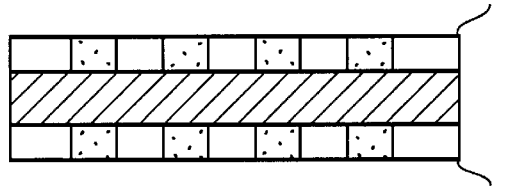
Figure 2F:
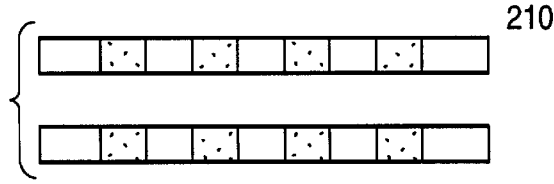
Figure 2G:
Figure 2H:
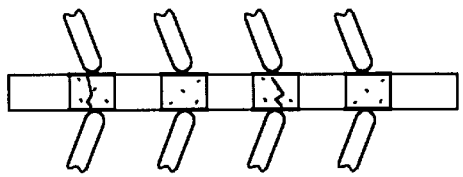
Figure 2I:
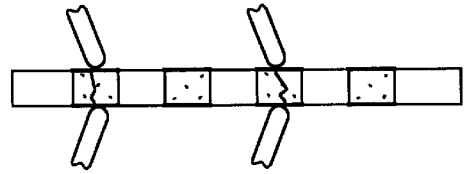
Figure 3A:
FIGS. 3A–3H illustrate a structures formed by the steps of another embodiment of this invention.
Figure 3B:
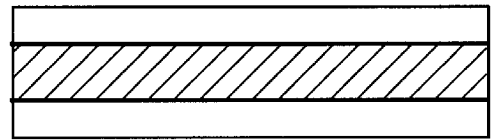
Figure 3C:
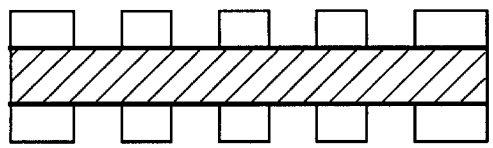
Figure 3D:
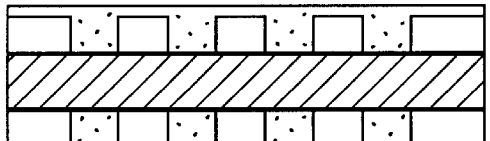
Figure 3E:
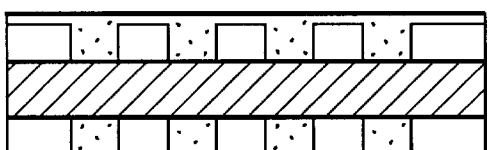
Figure 3F:
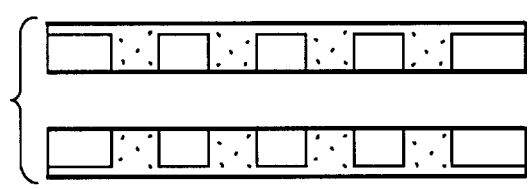
Figure 3G:
Figure 3H:
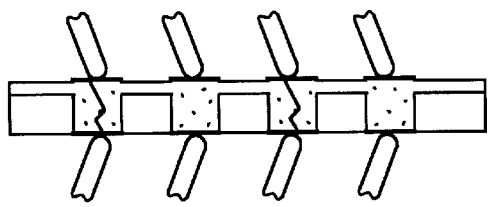

In one embodiment fabrication of a printed circuit board that contains the traces 131–136 and 121–128 and antifuse-vias 101–116 starts with a copper foil as the substrate, as illustrated in FIGS. 2A–2H. The copper foil 201 can be supported by an aluminum foil and held loosely by a glue (not shown). The other side of aluminum foil 202 can also support another thin layer of copper foil 203 and form a copper aluminum-copper foil structure (CAC) 200. Then an dielectric layer 204 is applied and imaged to create via opening holes 205A–205H. Then antifuse material 206A–206H is applied inside via holes 205A–205H through selective printing to form a compound layers 207 and 208. Alternatively, antifuse material can be applied to cover the entire dielectric surface and also fill the via hole as illustrated in FIG. 3D. Then metal layers 209 and 210 are formed on top of compound layers 207 and 208 through either chemical processing (electroless copper deposition or electrolytic copper deposition) or physical processing (similar to laminating copper foils). The bottom copper layers 201 and 203 are then separated from aluminum foil 202. Print and etch then can be done to create patterns of electrodes (FIG. 2G). The structure is in the laminate form, antifuse-vias can be programmed by addressing both electrodes from either side of the surface (FIG. 2H) or from the same side of the surface (FIG. 2I). All of the antifuse-vias 101–116 (FIG. 1) are programmed by FIG. 2H. This method solves the capacitance problem (above) and reduces or eliminates the Vpp/2 requirement (above). Wet chemical process using an acid can cause glue between copper foils 201 and 203 and aluminum foil 202 to unglue and is preferably avoided.

In one embodiment, a composite is formed of a polyimide or an epoxy as the polymer body and one or more type of conductive particles such as particles of nickel, silver and copper that form a volume fraction of 10–20 percent of the total composite volume.

Figure 2J:
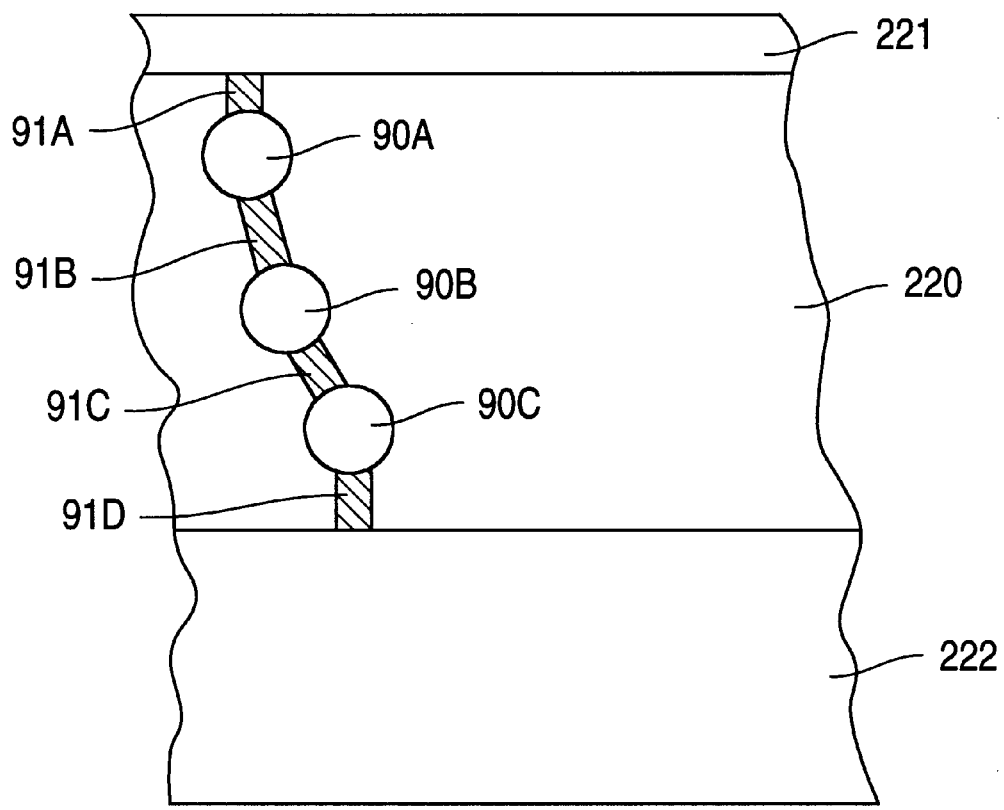
FIG. 2J illustrates the formation of a conductive link through the antifuse of FIG. 2H.

If a voltage is applied sufficient to cause a breakdown of the polymer body separating the conductive particles in a composite, a conductive path can be formed between the two electrodes of an antifuse, with minimal transportation of electrode material into the dielectric. For example, FIG. 2J illustrates a path formed by links 91A, 91B, 91C and 91D between conductive particles 90A, 90B, 90C, and the two electrodes 221–222 of an antifuse 220 (FIG. 2H). A link between two conductive particles can be formed due to fusion of the two conductive particles in the region where the dielectric between the particles breaks down.

If conductive particles in an antifuse have a lower melting temperature than the antifuse electrodes' melting temperature, deformation of the electrodes can be avoided. So conductive particles for an antifuse can be formed of low melting temperature materials, even if such materials are unsuitable for forming electrodes or interconnection traces of high melting-temperature.

The method illustrated in FIGS. 3A–3H is similar to the method described above for FIGS. 2A–2H, except for the difference noted above for FIG. 3D.

Figure 4A:
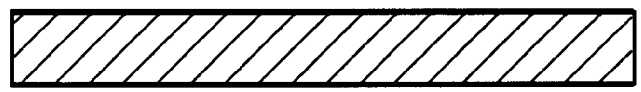
FIGS. 4A–4F illustrate a structures formed by the steps of another embodiment of this invention.
Figure 4B:
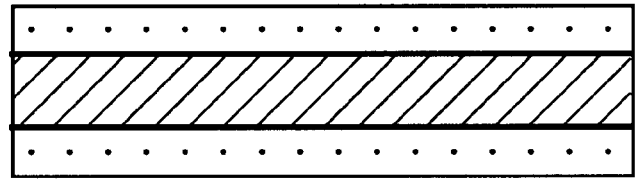
Figure 4C:
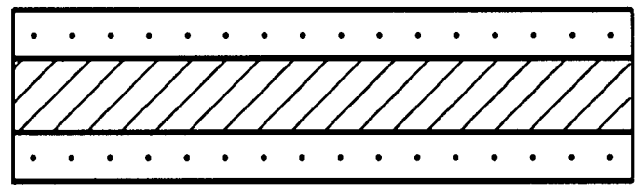
Figure 4D:
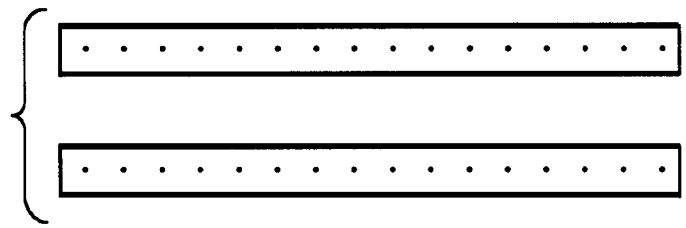
Figure 4E:
Figure 4F:
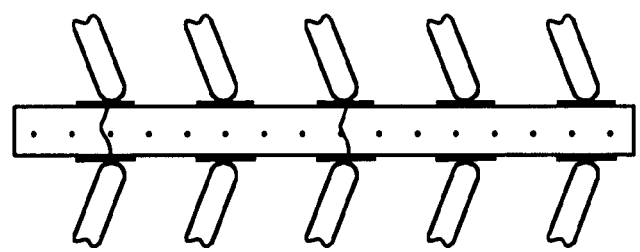

FIGS. 4A–4F illustrate another method similar to the method illustrated in FIGS. 2A–2I of except for the following differences. In the method of FIGS. 4A–4F a dielectric layer is not formed and photo via holes are not formed. Instead, antifuse material is directly applied to the copper layers as shown in FIG. 4B. The steps shown in FIGS. 4C–4E are similar to the steps shown in FIGS. 2E–2G. Then certain selected sites of antifuse material are programmed to form antifuse-vias at for example sites 501–516 (FIG. 5).

Figure 5:
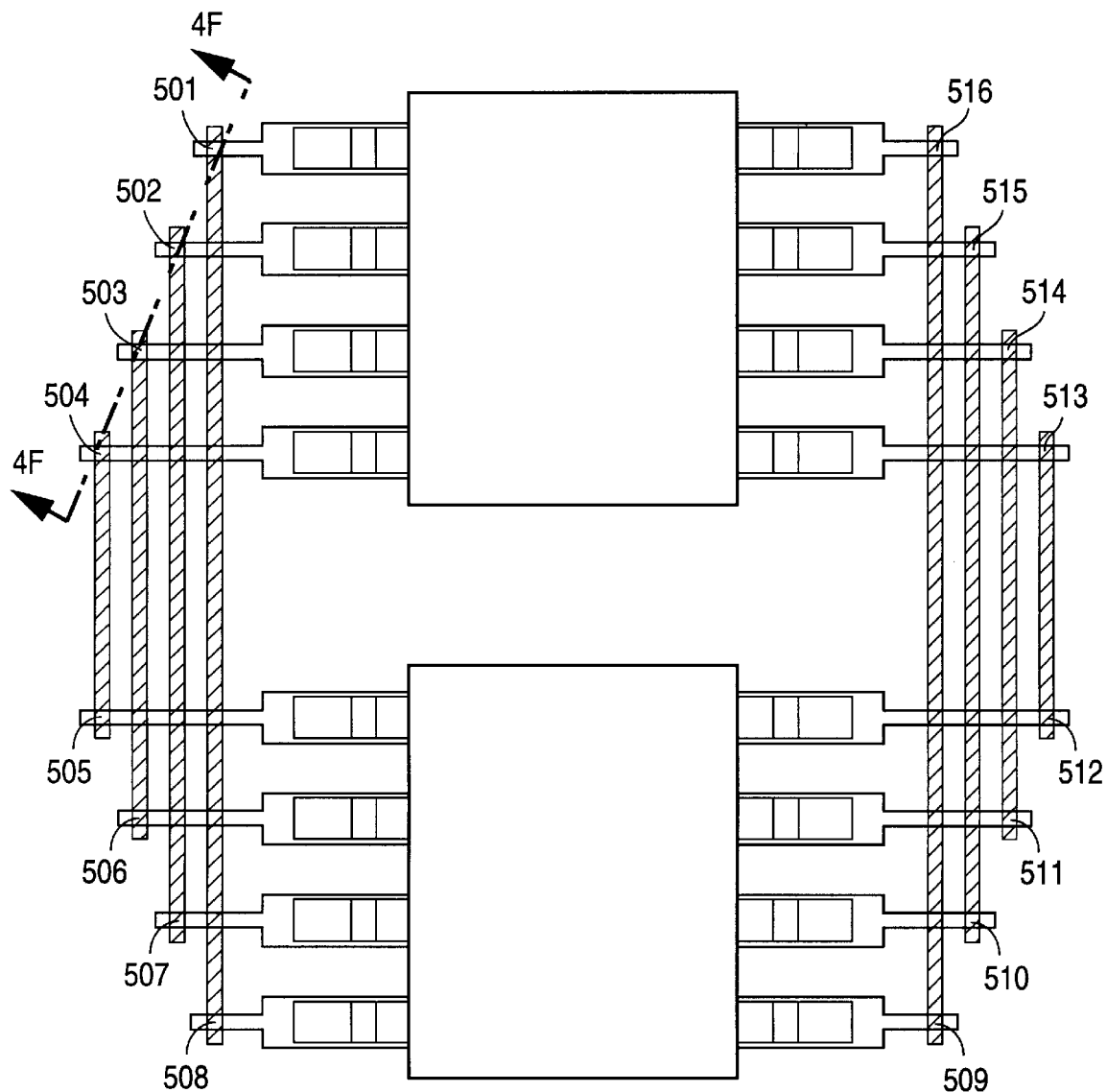
FIG. 5 illustrates in plan view the traces of another printed circuit board that has antifuse-vias.

In the embodiment of FIG. 5, laminate thickness is 2 mils(milli inches), for use in products such as flex circuits, PCMCIA cards and MCMs. The antifuse laminate thickness can be made from 0.5 mil to 5 mils. Also, by adjusting (increasing) the percentage of conductive particles to keep the programming voltage constant, the laminate can be made even thicker. The copper foil thickness is not critical to one embodiments of this invention. Conventional thickness of ¼, ½, 1, or 2 Ounce copper all can be used. The polymer base for the antifuse can be either epoxy resin, or polyimide. Other types of material, that offer low dielectric constant, such as fluorine based Teflon, PTFE, also can be used.

One advantage of this invention is that the structures shown in FIG. 4D can be made ahead of time, and sold as blanks to be customized by an end user, such as a printed circuit board (PCB) vendor. A PCB vendor can integrate use of such structures into a PCB process, instead of developing an antifuse process. In addition, antifuse-vias can be created at any overlapping area between conductive traces of two PCB layers and areas. Vias, which were necessary for the mechanical drilling are eliminated by this invention, which allows the via pitch (distance between two antifuse-vias) to be as small as, for example, 3 mils, while the line and space can be at 1 mil each in areas without a via. Another advantage is that antifuse vias can be done in multiple layers, even as the inner layers, to further reduce the board cost.

In order to eliminate the process routing constraint, another process alternative is proposed. In this process, via hole opening is created only in the place that needs a via. Then traces can cross over other lines without forming an unwanted antifuse via. The starting point is to have copper foils clad to both sides of a PCB core. Then print and etch step is done to form traces on the copper foils. Then via openings are formed. Methods of forming via holes include photo resist opening, laser drill, or dry film or liquid phase solder masking. Via hole size created by these methods could range from 1 to 10 mils easily. Then antifuse via material is applied over the top surface. It could be all over the surface or just in areas close to via holes. After processing, metal layers are applied to the top photoresist surface and/or antifuse surface. After the top metal layer is printed and etched to form traces.

Methods of applying antifuse materials over the whole surface include screen printing, liquid curtain coating, spraying, liquid immersion coating. An optional step is to apply antifuse material over a selective area near the via hole, for example, by screen printing. This will eliminate programming of an horizontal antifuse between the two adjacent lines which is discussed below. Several methods can be used to form the top electrode too. One method is by laminating a thin sheet of copper foil to the core followed by print and etch steps. Another method is by using the conventional electroless copper process followed by the electrolytic copper deposition to form the top electrode then followed by the print and etch steps. In this method, reducing the surface roughness treatment prior to applying the copper is important. There are methods available that reduce the surface roughness down to less than 1um.

A variation to the above process is eliminating the via opening step. Since coating over metal electrode will tend to be thinner than the area without electrode, the capacitance penalty could be less compared to the laminate process described earlier. But it still doesn't eliminate the programming of horizontal antifuse problem as it is only space limited.

The preferred process in this case is the antifuse built inside the via opening to create an antifuse via. The photoresist process is preferred to create a via hole opening. The hole diameter is 5 mils although as low as two mils are doable. The antifuse material is best applied by liquid immersion coating if the whole surface is coated. In the selected coating method, the preferred method is by screen printing. The top electrode is applied by laminating the foil to the antifuse surface followed by print and etch process.

The advantage of this process is that it reduces substantially the signal cross talk issue between two metal traces. The photo resist thickness or solder mask thickness used to open the via can be adjusted. Also, the adjustment of this thickness permits impedance control of the signals. In the PCB design, controlling impedance of the signal is very important for the high speed application of the board. And the impedance control can't be accomplished if the line space and layer thickness cannot be adjusted over a required range. Another advantage is that now the antifuse via only occurs in the places that is needed, the cross over of lines becomes possible as there is no via in the cross over where there is no need for connection. This allows the routing of traces to be done much more effectively.

One of the disadvantages is that the requirement of a core for the process limits the antifuse via to only one side of the board. For connections between layers on the opposite side of the core, drilled vias are necessary.

As used in this application, an "antifuse-via" is any electrical conductor formed between two electrodes in two layers of a printed circuit board that are separated by at least a layer of antifuse material wherein the conductor is formed by applying a programming voltage across the two electrodes. In one embodiment the antifuse material is a dielectric material that has a low breakdown voltage compared to the breakdown voltage of all other dielectric materials in the printed circuit board.

Several considerations are taken into account in selecting the antifuse material. First, in a programmable antifuse matrix, only a small number of antifuses need to be programmed while the majority of antifuses remain open in a printed circuit board that implements a predetermined circuit. To ensure that an unprogrammed antifuse remains open, the antifuse in an antifuse matrix is designed to sustain electrostatic discharge ("ESD") damage. On the other hand, in the present invention there is no antifuse-via that remains open in a printed circuit board that implements a predetermined circuit, because each antifuse via is located between and shorts two electrodes that are to be connected. Therefore even if the antifuse-via suffers some ESD damage, in principle, the antifuse-via can still be programmed to create a more controllable short because uncontrolled ESD damage can result in a resistance that is very high, higher than the specified tolerance.

Conductive particles in an antifuse material can have shapes other spherical, which is preferred for the antifuse matrix material.

Second, an unprogrammed antifuse in an antifuse matrix is designed to sustain a voltage Vpp/2 (Vpp being a predetermined programming voltage) during programming to protect all unprogrammed antifuses from being accidentally programmed. Such a design limits the choice of ingredients used in antifuse material as well as the percentage of the ingredients. The antifuse material for an antifuse via is not limited by processes that require a Vpp/2 constraint. The choice of antifuse material such as the type of polymer or the shape and size of conductive particle can all be different from the antifuse material for forming an antifuse matrix. In one embodiment, the antifuse material can be chosen to be conductive epoxy resin. Also, programming methods and constraints on the programming methods all become different as discussed below.

Antifuse material for antifuse-via is preferably nonconductive. Also, the antifuse material should be compatible with conventional printed circuit board (PCB) processes. Polymers, either thermoplastic or thermosetting, can be used as an ingredient of antifuse material. Other materials, such as epoxy, or polyimide can also be used in the antifuse material. To reduce the voltage needed to program the antifuse-via, conductive particles can be included in the antifuse material as described in the U.S. patent application referenced above. The percentage of conductive particles can be between 10–50%. Also, the programming voltage depends on the particle size and particle shape. Larger conductive particle size is preferred for an antifuse-via for carrying higher currents.

Low resistivity conductive particles are preferred as they can lower the resistance of the antifuse via. Therefore conductive particles can be formed of copper, nickel, palladium, platinum, all of which have low resistivities. Low melting metals are also preferred for conductive particles because such metals promote better interface connection between two adjacent particles. Conductive particles can be formed of lead/tin compound, silver/tin compound, tin, nickel/tin, all of which have low melting temperatures. In general a low melting compound has high resistivity while a low resistivity metal has a high melting point. To take advantage of both characteristics, one can coat a low melting metallic compound or metal outer layer on a highly conductive but high melting inner coil. The low melting compound outer layer promotes a good contact between the particles and the electrode surface during programming. The highly conductive inner core it reduces the antifuse-vias resistance after programming. A particle's inner core can be formed of copper, silver, silver/tin, palladium, etc. A particle's outer layer can be formed of lead/tin alloy, silver/tin alloy, tin, etc. If current carrying is not critical, particles can include low melting materials, such as silver/tin, lead/tin and tin. The choice of material included in an antifuse particle depends on the purpose and requirement of the printed circuit board to be manufactured.

Particle size and shape can also be selected for optional characteristics for an antifuse-via. The particle shape for an antifuse matrix is preferred to be round. Since an unprogrammed antifuse can be tied to half of the programming voltage (Vpp), the antifuse material is selected so that the antifuse does not break down during the programming period. The choice of shape and size of the particle can be selected to provide a tight, controllable programming voltage range and programming time. In one embodiment, spherical particles are mixed uniformly. The particle size can be chosen so that the particles remain unagglomerated and yet are smaller than the antifuse thickness. In the present invention, all the antifuse-vias are programmed eventually and no antifuse-via remains open. Also the programming voltage range doesn't have to be controlled as tightly because of the lack of the Vpp/2 constraint discussed above. Nonspherical particles such as spikes and long rod, can also be used in the present invention. Such non-spherical particles promote programming at a lower voltage without need for a higher percentage of particle in the antifuse material. The nonspherical shape also results in low capacitance of the antifuse via. In the following description spherical particles are used only as an example of the particle shape.

Larger particle size is preferred for the antifuse material used in the present invention. Larger particles provide higher programming current carrying capability. It is preferable that an antifuse-via carry a higher current than a programmed antifuse of an antifuse matrix. For a typical antifuse-via with a 1–2 mil (50 μm) thickness, the preferred particle size (diameter) is between 5 μm to 20 μm. Particle size as large as the antifuse via thickness can create a short essentially inside the antifuse via.

A "horizontal" electrical conductor can form through antifuse material between two adjacent metal lines (i.e. traces or electrodes) of a single conductive layer if the antifuse material completely covers a dielectric layer. The distance between these two lines should be larger than the height of an adjacent antifuse-via to ensure that a short is avoided between two lines during programming to form the antifuse-via. To ensure safety, distance between two lines can be selected to be at least twice the height of an antifuse-via plus process variation considerations. Formation of a horizontal electrical conductor can be totally avoided if the antifuse material is applied only inside a via hole or partially outside the via hole, but not continuously between two adjacent metal lines.

A printed circuit board dielectric material includes any conventional dielectric material that is used to form a printed circuit board.

Various modifications and adaptations of this invention are encompassed by the accompanying claims.

We claim:

1. A method for preparing a printed circuit board, the method comprising:

applying a first dielectric material on a first conductive layer, the first dielectric material including a printed circuit board dielectric material;

forming a plurality of holes at a plurality of predetermined locations in said first dielectric material, each of said predetermined locations being a location for formation of an electrical conductor;

applying a predetermined material to at least fill each of said plurality of holes, to form a compound layer, the predetermined material including a polymer and a plurality of conductive particles;

applying a second conductive layer on said compound layer by an act selected from the group consisting of electroless copper deposition, electrolytic copper deposition and laminating;

etching said first conductive layer to form a first electrode; and etching said second conductive layer to form a second electrode.

2. The method of claim 1 further comprising applying a programming voltage across said predetermined material in one of said holes to form an electrical conductor in said hole, said electrical conductor connecting said second electrode to said first electrode wherein said step of etching said first conductive layer is performed after said step of applying said programming voltage.

3. The method of claim 1 wherein said predetermined material is applied to cover all of said first dielectric material.

4. The method of claim 1 further comprising laminating another printed circuit board to the printed circuit board.

5. The method of claim 1 wherein said polymer has a breakdown voltage lower than the breakdown voltage of said first dielectric material.

6. The method of claim 1 wherein said predetermined material includes a conductive particle and said conductive particle forms at least a portion of an electrical conductor connecting said first electrode to said second electrode during application of said programming voltage.

7. The method of claim 1 wherein the printed circuit board dielectric material includes solder mask.

8. The method of claim 1 wherein the printed circuit board dielectric material includes epoxy.

9. The method of claim 1 wherein the printed circuit board dielectric material includes photo imagible polyimide.

10. The method of claim 1 wherein the act of applying a predetermined material includes selective printing.

11. The method of claim 1 wherein the act of forming is selected from the group consisting of photo resist opening, laser drill, and solder masking.

12. The method of claim 1 wherein the act of forming is photo resist opening.

13. A method for preparing a printed circuit board, the method comprising:

applying a printed circuit board dielectric material on a first conductive layer;

forming a plurality of holes at a plurality of predetermined locations in said printed circuit board dielectric material, each of said predetermined locations being a location for formation of an electrical conductor;

applying a predetermined material to at least fill each of said plurality of holes, to form a compound layer, the predetermined material including a polymer and a plurality of conductive particles; and applying a second conductive layer on said compound layer.

14. The method of claim 13, wherein the act of applying a second conductive layer includes laminating.

15. A method for preparing a printed circuit board, the method comprising:

applying a photo imagible dielectric material on a first conductive layer;

photoimaging said photo imagible dielectric material to form a plurality of holes at a plurality of predetermined locations;

applying a predetermined material to at least fill each of said plurality of holes, to form a compound layer; and laminating a second conductive layer on said compound layer.

16. The method of claim 15, wherein the predetermined material includes a polymer and a plurality of conductive particles.

17. The method of claim 15 wherein the photo imagible dielectric material includes photo imagible polyimide.

* * * * *